(12) United States Patent
Uochi et al.

(10) Patent No.: US 6,396,078 B1
(45) Date of Patent: *May 28, 2002

(54) SEMICONDUCTOR DEVICE WITH A TAPERED HOLE FORMED USING MULTIPLE LAYERS WITH DIFFERENT ETCHING RATES

(75) Inventors: Hideki Uochi; Masahiko Hayakawa; Mitsunori Sakama; Toshimitsu Konuma, all of Kanagawa; Shunpei Yamazaki, Tokyo, all of (JP)

(73) Assignee: Semiconductor Energy Laboratory Co., Ltd., Atsugi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/666,104

(22) Filed: Jun. 19, 1996

(30) Foreign Application Priority Data

Jun. 20, 1995 (JP) .............................. 7-176801
Jan. 10, 1996 (JP) .............................. 8-20540

(51) Int. Cl.⁷ ................... H01L 29/76; H01L 29/04; H01L 27/01; H01L 23/58
(52) U.S. Cl. .............. 257/66; 257/57; 257/72; 257/347; 257/640; 257/641; 257/644
(58) Field of Search ................... 257/66, 641, 72, 257/57, 347, 639, 640, 644, 758, 635; 427/82; 156/643; 438/163; 437/21

(56) References Cited

U.S. PATENT DOCUMENTS

| | | | |
|---|---|---|---|
| 4,495,220 A | 1/1985 | Wolf et al. | 427/82 |
| 4,814,041 A | 3/1989 | Auda | 156/643 |
| 5,258,645 A | * 11/1993 | Sato | 257/641 |
| 5,371,398 A | * 12/1994 | Nishihara | 257/57 |
| 5,475,238 A | * 12/1995 | Hamada | 257/66 |
| 5,583,347 A | * 12/1996 | Misawa et al. | 257/72 |
| 5,619,045 A | * 4/1997 | Konuma et al. | 257/72 |
| 5,620,905 A | 4/1997 | Konuma et al. | 438/163 |
| 5,719,065 A | 2/1998 | Takemura et al. | 437/21 |

FOREIGN PATENT DOCUMENTS

| | | | | |
|---|---|---|---|---|
| JP | 50-123274 | | 9/1975 | 257/644 |
| JP | 63-271957 | | 11/1988 | 257/758 |
| JP | 64-32678 | * | 2/1989 | 257/66 |
| JP | 1-272121 | | 10/1989 | 257/635 |
| JP | 4-9030 | * | 1/1992 | 257/72 |

OTHER PUBLICATIONS

Hayashi, et al., "Fabrication of Low–Temperature Bottom–Gate Poly–Si TFTs on Large–Area Substrate by Linear–Beam Excimer Laser Crystallization and Ion Doping Method," IEEE, International Electron Device Meeting, pp. 829–832, 1995.

* cited by examiner

Primary Examiner—Steven Loke
(74) Attorney, Agent, or Firm—Fish & Richardson P.C.

(57) ABSTRACT

A semiconductor device having an improved contact hole through an interlayer insulator. A first insulating film comprising silicon nitride is deposited. A second insulating film comprising silicon oxide is deposited on the first insulating film. The deposition condition of the second insulating film is varied during the deposition so that the etching rate of the second insulating film increases from a lower portion toward an upper portion. Thereby, a contact hole which is formed by etching through the first and second insulating films has a tapered configuration to improve a reliability of a connection made therein.

14 Claims, 10 Drawing Sheets

SEMICONDUCTOR DEVICE WITH A TAPERED HOLE FORMED USING MULTIPLE LAYERS WITH DIFFERENT ETCHING RATES

BACKGROUND OF THE INVENTION

1. Field of the Invention

The present invention relates to a manufacturing method of a semiconductor device having a multi-layer wiring structure and, more specifically, to a method of forming contact holes through an interlayer insulating film.

2. Description of the Related Art

In a semiconductor device having a multi-layer wiring structure, upper-layer wiring lines (interconnections) and lower-layer wiring lines are connected to each other such that contact holes are formed through an interlayer insulating film that is formed on the lower-layer wiring lines and the upper-layer wiring lines are formed through the contact holes.

Conventionally, contact holes are required to be tapered to improve the step coverage of upper-layer wiring lines at contact holes. Japanese Unexamined Patent Publication No. 50-123274 discloses a method of tapering a contact hole by forming an interlayer insulating film as two-layer silicon films that are respectively formed through thermal oxidation and CVD and utilizing an etching rate difference between the two layers due to the different methods of forming those layers.

When part of an interlayer insulating film is formed through thermal oxidation as in the conventional example, heating is performed at a temperature of 500° C. or more. However, in semiconductor devices such as a thin-film transistor, a wiring line under an interlayer insulating film, that is, a gate electrode is made of aluminum, which tends to diffuse into the surrounding portions when heated at a temperature of 450° C. or more. If diffused aluminum passes through a gate insulating film under the gate electrode and further goes into a semiconductor layer under the gate insulating film, there may occur a failure in operation or short-circuiting. For this reason, in a semiconductor device in which a lower-layer wiring line is formed with aluminum, thermal oxidation cannot be employed. Therefore, an interlayer insulating film is formed in a single-layer structure only through CVD method.

To form a tapered contact hole through an interlayer insulating film of a single-layer structure, etching conditions such as an etching time need to be controlled strictly. For example, the etching time is too long, the side wall of a contact hole becomes vertical to the bottom surface, that is, the contact hole cannot be tapered, possibly resulting in disconnection of a wiring line.

Further, to etch an interlayer insulating film completely, overetching of several tens of seconds is generally performed. This may cause a problem that a wedge-shaped recess is formed between a semiconductor layer of a source/drain region and the interlayer insulating film.

Referring to FIG. 4A, reference numeral 401 denotes a crystalline silicon semiconductor layer and numeral 402 denotes an interlayer insulating film that is a single-layer oxide film. In forming a contact hole by etching a desired portion of the interlayer insulating film 402, if there exists a protrusion of dust or the like between the semiconductor layer 401 and the interlayer insulating film 402, an etching liquid may soak through it, resulting in the formation of a wedge-shaped recess 403. As an example of the dust, an oxide or fluoride of aluminum which constitutes an aluminum wiring has been recognized by the inventors of the present invention.

In this case, when a wiring electrode 404 is formed as shown in FIG. 4B, it is difficult to cover the wedge-shaped recess 403, possibly resulting in disconnection of the wiring line. FIGS. 9A and 9B are SEM photographs showing the structure of FIG. 4. FIG. 9B is an enlarged view of an encircled portion of FIG. 9A. In FIG. 9B, reference numerals 404a and 404b are a titanium wiring and an aluminum wiring, respectively.

Where a pixel area or a peripheral driver circuit of an active matrix liquid crystal display device is formed by using thin-film transistors, several hundred to several thousand thin-film transistors are formed on the same substrate at the same time. Since disconnection of a wiring line even in a single thin-film transistor may lead to a failure of the entire substrate, the production yield will be reduced.

SUMMARY OF THE INVENTION

An object of the present invention is to provide, by solving the above problems, a manufacturing method of a semiconductor device which method can form, by a common etching method, a tapered contact hole through an interlayer insulating film formed only by CVD.

Another object of the invention is to improve the production yield of semiconductor devices by forming contact holes that are free of recesses and enable good coverage of wiring lines.

To solve the above problems, according to a first aspect of the invention, there is provided a manufacturing method of a semiconductor device, comprising the steps of:

forming a metal conductive layer or a semiconductor layer;

forming an insulating film by CVD so that it covers the metal conductive layer or the semiconductor layer, and that an etching rate of the insulating film increases continuously or in a step-like manner as a position goes up by varying film forming conditions continuously or in a step-like manner; and forming a contact hole by etching a desired portion of the insulating film.

According to a second aspect of the invention, there is provided a manufacturing method of a semiconductor device, comprising the steps of:

forming a metal conductive layer or a semiconductor layer;

forming an insulating film by CVD so that it covers the metal conductive layer or the semiconductor layer, and that an etching rate of the insulating film increases continuously or in a step-like manner as a position goes up; and forming a contact hole by etching a desired portion of the insulating film.

According to a third aspect of the invention, there is provided a manufacturing method of a semiconductor device, comprising the steps of:

forming an active layer on a substrate surface;

forming a first insulating film on the active layer;

forming a wiring layer on the first insulating film;

exposing a desired surface portion of the active layer by etching the first insulating film;

forming a second insulating film by CVD so that it covers the exposed surface portion of the active layer and the wiring layer, and that an etching rate of the second insulating film increases continuously or in a step-like manner as a position goes up; and forming a contact hole by etching a desired portion of the second insulating film.

According to a fourth aspect of the invention, there is provided a manufacturing method of a semiconductor device, comprising the steps of:

forming a wiring layer with aluminum or metal mainly made of aluminum;

forming an insulating film by CVD so that it covers the wiring layer, and that an etching rate of the insulating film increases continuously or in a step-like manner as a position goes up; and forming a contact hole by etching a desired portion of the insulating film.

According to a fifth aspect of the invention, there is provided a manufacturing method of a semiconductor device, comprising the steps of:

forming a metal conductive layer or a semiconductor layer;

forming an insulating film by CVD so that it covers the metal conductive layer or the semiconductor layer, a lowermost layer of the insulating film being a silicon nitride film of 200 to 500 Å in thickness; and forming a contact hole by etching a desired portion of the insulating film.

The silicon nitride film may be formed through plasma CVD by using silane ($SiH_4$), ammonia ($NH_3$), and nitrogen ($N_2$) as material gases. It is desired that the silicon nitride film be so dense as to be etched by buffered hydrofluoric acid at a rate of 800 to 1,000 Å/min.

In the manufacturing method of a semiconductor device according to the first aspect of the invention, in forming an insulating film by CVD so that it covers the metal conductive layer or the semiconductor layer, the film forming conditions are varied continuously or in a step-like manner so that the etching rate of the insulating film increases continuously or in a step-like manner as the position goes up. When this insulating film is etched, the opening becomes smaller as the position goes down, that is, a tapered contact hole is formed.

In the manufacturing method of a semiconductor device according to the second aspect of the invention, an insulating film covering the metal conductive layer or the semiconductor layer is formed by CVD so that the etching rate of the insulating film increases continuously or in a step-like manner as the position goes up. When this insulating film is etched, the opening becomes smaller as the position goes down, that is, a tapered contact hole is formed.

In the manufacturing method of a semiconductor device according to the third aspect of the invention, by exposing a desired surface portion of the active layer by etching the first insulating film under the wiring layer, the active layer and the wiring layer are covered only with a second insulating film that is formed by CVD so that its etching rate increases continuously or in a step-like manner as the position goes up. Thus, tapered contact holes for the active layer and the wiring layer are formed by the same etching step. For example, in manufacturing a thin-film transistor, contact holes for the source/drain regions and the gate electrode are so formed as to assume a tapered profile.

In the manufacturing method of a semiconductor device according to the fourth aspect of the invention, a wiring layer is formed with aluminum or metal mainly made of aluminum, and an insulating film to cover the wiring layer is formed by CVD so that its etching rate increases continuously or in a step-like manner as the position goes up. When this insulating film is etched, the opening becomes smaller as the position goes down, that is, a tapered contact hole is formed through the insulating film. By virtue of the use of CVD, a multi-layer insulating film is formed at such a temperature that there occurs neither diffusion of aluminum that constitutes a wiring line nor abnormal crystal growth of aluminum.

In the manufacturing method of a semiconductor device according to the fifth aspect of the invention, a silicon nitride film of 200 to 500 Å in thickness is formed as the lowermost layer of an interlayer insulating film. Since the silicon nitride film has a lower etching rate than a silicon oxide film, it not only contributes to formation of a tapered contact hole but also prevents formation of a wedge-shaped recess in a bottom portion of a contact hole.

In the invention, as described above, the film forming conditions are varied continuously or in a step-like manner so as to form insulating films having different etching rates. For example, a silicon nitride film is deposited by plasma CVD as a lowermost layer, and silicon oxide films are deposited by plasma CVD while the rf output value is varied continuously or in a step-like manner. In another example, without depositing a lowermost silicon nitride film, only silicon oxide films are deposited by plasma CVD while the rf output value is varied continuously or in a step-like manner.

That is, to form insulating films having multiple layer of different etching rates, it is utilized that films having different compositions such as a silicon nitride film and a silicon oxide film exhibit different etching rates, and that the etching rate of a silicon oxide film is higher when the rf output value is smaller.

DETAILED DESCRIPTION OF THE PREFERRED EMBODIMENTS

The present invention will be hereinafter described by way of illustrated embodiments.

Embodiment 1

FIGS. 1A to 1F are sectional views of a semiconductor device which correspond to respective manufacturing steps according to a first embodiment of the invention. This embodiment is directed to a case where the invention is applied to a thin-film transistor having a gate electrode mainly made of aluminum.

Figure 1A:
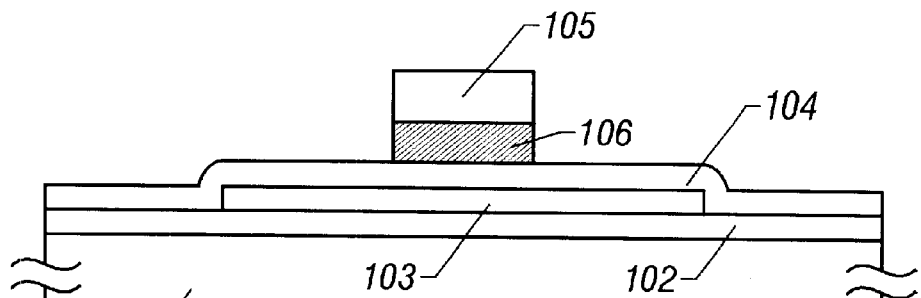
FIGS. 1A to 1F are sectional views shown a manufacturing method of a semiconductor device according to a first embodiment of the invention.

As shown in FIG. 1A, a 3,000-Å-thick undercoat film 102 is formed on a glass substrate 101 by plasma CVD. An amorphous silicon film of 300 to 1,000 Å (500 Å in this embodiment) in thickness is formed on the undercoat film 102 by plasma CVD or low-pressure CVD. The amorphous silicon film is a starting film for forming an active layer of the thin-film transistor. Laser light is applied to the amorphous silicon film to crystallize it. In this embodiment, KrF excimer laser light is applied to the amorphous silicon film to crystallize it, that is, to form a crystalline silicon film. The crystalline silicon film is etched into an island-like silicon film 103.

Thereafter, a silicon oxide film 104 of 500 to 1,500 Å in thickness is formed by plasma CVD or sputtering. Further, an aluminum film of 2,000 to 8,000 Å (4,000 Å in this embodiment) in thickness is formed by electron beam evaporation or sputtering. To suppress an abnormal crystal growth of the aluminum film during heating or a later-described anodization step, scandium (Sc) or yttrium (Y) is mixed in advance into aluminum at 0.1 to 0.5 wt %.

After a very thin (50 to 200 Å) anodic oxide film (not shown) is formed on the aluminum film to provide good adhesion of a photoresist, a photoresist is applied thereto. After a photoresist mask 105 is formed by a known lithographic method, the aluminum film is etched into a gate electrode 106 by using the photoresist mask 105. In general, the gate electrode 106 is called a first wiring layer. Thus, a structure of FIG. 1A is obtained.

Figure 1B:
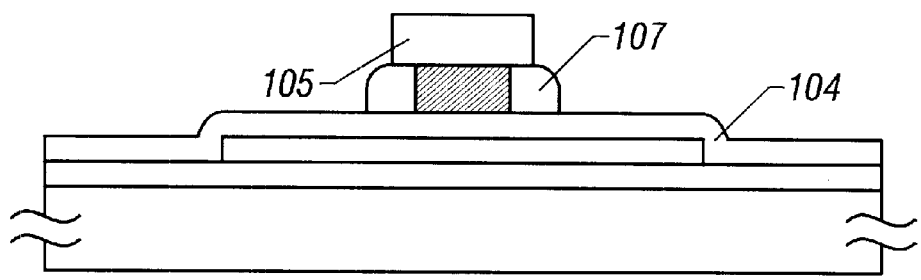

Then, as shown in FIG. 1B, with a photoresist mask 105 remaining on the surface of the gate electrode 106, a porous anodic oxide 107 is formed on only the side surface of the gate electrode 106 by anodic oxidation in an electrolyte using the gate electrode 106 as an anode. In this embodiment, a voltage of 10 V is applied to the above structure immersed in an oxalic acid solution of 30° C. The thickness of the porous anodic oxide layers 107 can be controlled by the voltage application time.

Figure 1C:
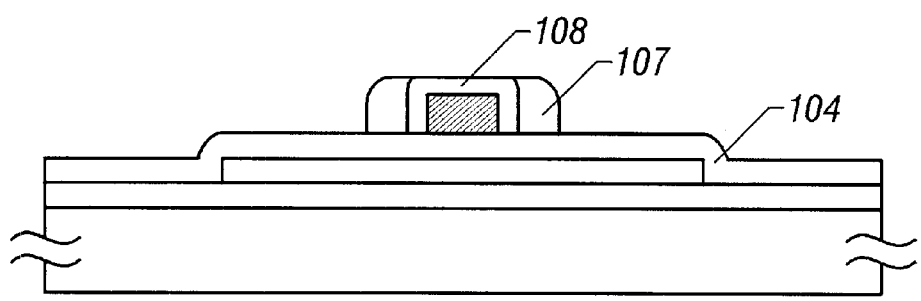

Then, as shown in FIG. 1C, a dense anodic oxide layer 108 is formed on the front and side faces of the gate electrode 106 by again applying a voltage to the gate electrode 106 in an electrolyte after the photoresist mask 105 has been removed. Since the thickness of the dense anodic oxide layer 108 is approximately proportional to the application voltage, the voltage may be so controlled that the dense anodic oxide layer 108 will have a desired thickness. The dense anodic oxide film 108 has a 2,000-Å thickness when the application voltage is 150 V. In this embodiment, the dense anodic oxide film 108 is formed at a thickness of 1,500 Å by applying a voltage of 120 V to the structure in an ethylene glycol solution containing tartaric acid, boric acid, and nitric acid each at 3 to 10%.

Figure 1D:
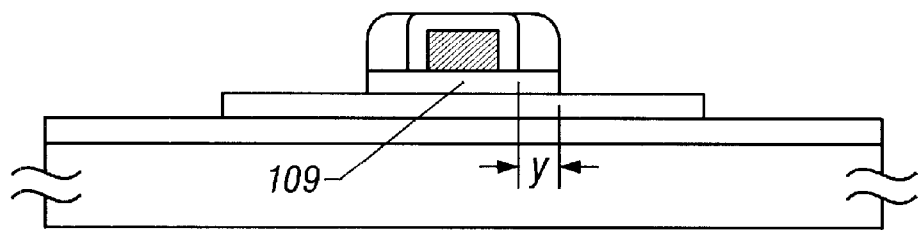

Thereafter, the silicon oxide film 104 is etched by dry etching. In this case, the silicon oxide film 104 is etched while the anodic oxide layers 107 and 108 are not etched, that is, serve as a mask. Thus, a gate insulating film 109 is formed as shown in FIG. 1D.

Then, the porous anodic oxide layers 107 are etched by using a mixed acid of phosphoric acid, acetic acid, and nitric acid. In this case, only the porous anodic oxide layers 107 are etched while the dense anodic oxide layer 108 and the gate insulating film 109 are left as they are. The etching rate of the porous anodic oxide layers 107 is about 600 Å/min.

Figure 1E:
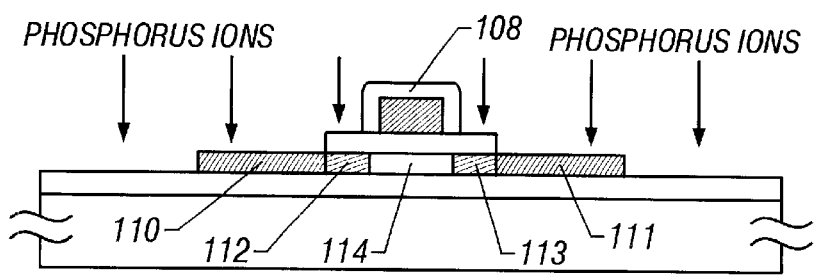

Subsequently, as shown in FIG. 1E, impurity ions are implanted into the island-like silicon film 103 with the gate electrode 106, the dense anodic oxide layer 108, and the gate insulating film 109 used as masks. In this embodiment, phosphorus ions are implanted which impart N-type conductivity.

It is preferred that hydrogen-diluted phosphine (for instance, 5%-$PH_3$ and 95%-$H_2$) be used as a doping gas, the acceleration voltage be set at 10 to 30 kV, and the dose amount be set at $1\times10^{14}$ to $8\times10^{15}$ atoms/cm$^2$. In this embodiment, the acceleration voltage is set at 10 kV and the dose amount is set at $5\times10^{14}$ atoms/cm$^2$.

As a result, impurity ions are implanted at a high concentration in portions of the island-like silicon film 103 which are not covered with the gate insulating film 109, so that a source region 110 and a drain region 111 are formed there. Only part of impurity ions that have passed through the gate insulating film 109 are implanted in portions of the island-like silicon film 103 which are covered with the gate insulating film 109 so that low-concentration impurity regions 112 and 113 are formed there. Substantially no impurity ions are implanted in a portion of the island-like silicon film 103 which is covered with the gate electrode 106, so that a channel region 114 is formed there. That is, the source region 110, the drain region 111, the low-concentration impurity regions 112 and 113, and the channel region 114 are formed in a self-aligned manner with the dense anodic oxide layer 108, and the gate insulating film 109 serving as masks.

The difference in impurity ion concentration between the source/drain regions 110 and 111 and the low-concentration impurity regions 112 and 113 is determined by the thickness of the gate insulating film 109. Usually, the impurity ion concentration of the low-concentration impurity regions 112 and 113 is set 0.5 to 3 orders lower than that of the source/drain regions 110 and 111. The length of the low-concentration impurity regions 112 and 113 is determined by a projection length y of the gate insulating film 109 from the side faces of the dense anodic oxide layer 108. As shown in FIG. 1D, the length y is determined in a self-aligned manner by the width of the porous anodic oxide layers 107.

Then, a laser light irradiation is performed in order to activate the implanted impurity ions as well as to anneal the source/drain regions 110 and 111 and the low-concentration impurity regions 112 and 113 that were damaged by the implantation of impurity ions.

Subsequently, a multi-layer interlayer insulating film is formed by plasma CVD. This is done such that a film having a smallest etching rate constitutes a lowest layer and a film having a largest etching rate constitutes an uppermost layer with the intermediate layers made of films whose etching rate increases as the layer goes higher. In this embodiment, a three-layer interlayer insulating film is formed. Tapered contact holes can be formed by etching this interlayer insulating film.

Figure 2:
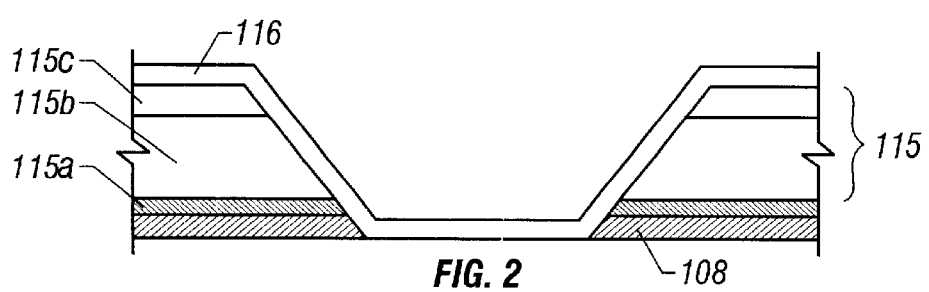
FIG. 2 is a sectional view of a contact hole for a gate electrode.
Figure 7A:
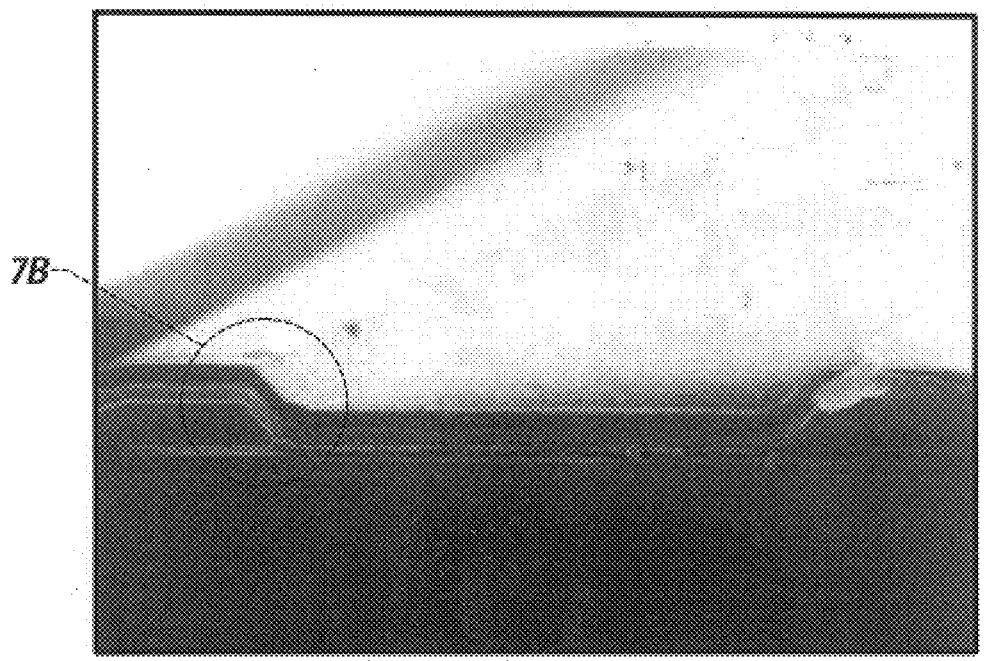
FIGS. 7A and 7B are SEM photographs corresponding to FIG. 2.
Figure 7B:
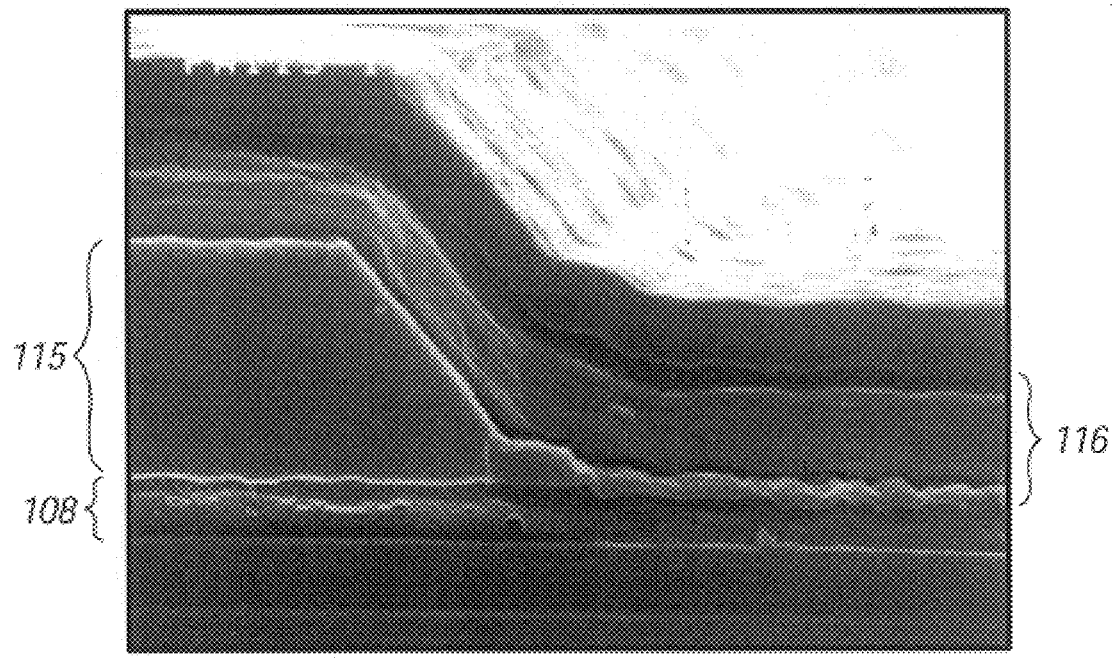

FIG. 2 is an enlarged sectional view of a contact hole for the gate electrode 106. Contact holes for the source/drain regions 110 and 111 are basically the same as the contact hole for the gate electrode 106 except that they are not associated with the dense anodic oxide layer 108. FIGS. 7A is a SEM photograph corresponding to FIG. 2. Further, FIG. 7B is an enlarged photograph of the encircled portion of FIG. 7A.

First, a 500-Å-thick silicon nitride film 115a is formed by plasma CVD as the first layer of an interlayer insulating film 115. As the second and third layers, silicon oxide films, which have a higher etching rate than a silicon nitride film, are formed by plasma CVD by using a TEOS gas as a material gas. In this case, the second and third layers are so formed as to have different etching rates by utilizing the fact that the etching rate of a silicon oxide film is higher when the rf output value during the film formation is smaller. In this embodiment, a second-layer silicon oxide film 115b is formed at a thickness of 5,000 Å with an rf output value of 300 W, and a third-layer silicon oxide film 115c is formed at a thickness of 1,000 Å with an rf output value of 50 W. Thus, the interlayer insulating film 115 has a thickness of 6,500 Å.

Contact holes are formed by etching the multi-layer interlayer insulating film 115 and the dense anodic oxide layer 108, and then electrodes/wiring lines are formed.

To form contact holes, first the interlayer insulating film 115 is etched. Any etching liquid can be used as long as it can etch a silicon nitride film and a silicon oxide film. Buffered hydrofluoric acid (BHF; $NH_3F:HF=10:1$), which is commonly used in the art, is used in this embodiment. In this case, at 20° C., the first-layer silicon nitride film 115a, the second-layer silicon oxide film 115b, and the third-layer silicon oxide film 115c exhibit etching rates of about 750 Å/min, about 2,700 Å/min, and about 4,270 Å/min, respectively. Due to these differences in etching rate, contact holes are so formed that the opening is gradually narrowed as the position goes down, that is, tapered contact holes are formed through etching of the interlayer insulating film 115 as shown in FIG. 2. Contact holes for the source/drain regions 110 and 111 are formed in this manner.

As for a contact hole for the gate electrode 106, the dense anodic oxide layer 108 serves as an etching stopper.

The etching time of the interlayer insulating film 115 may be calculated based on the relationship between the etching rate and the thickness of each of the films 115a to 115c. To completely remove the interlayer insulating film 115, the actual etching time is set about 60 seconds longer than the theoretical etching time. The dense anodic oxide layer 108 is etched after the etching of the interlayer insulating film 115 is completed.

To etch the dense anodic oxide layer 108, an etching liquid that is commonly used for etching of aluminum oxide is used. In this embodiment, etching is performed for 4 minutes by using a mixed acid of 3%-phosphoric acid and 3%-chromic anhydride acid which is heated to 70° C. Since the interlayer insulating film 115 over the dense anodic oxide layer 108 is etched to assume a tapered profile, the dense anodic oxide layer 108 is also tapered through etching without forming a recess. Thus, a tapered contact hole for the gate electrode 106 is formed as shown in FIG. 2. The etching rate of the dense anodic oxide layer 108 is about 400 Å/min.

Further, etching is performed for about 60 seconds by using a 1/100-diluted hydrofluoric acid. This is done to remove a high-resistivity region called a passive layer that is formed on the surface of the gate electrode 106 due to the etching with a chromic acid mixture. Thereafter, a metal wiring layer called as a second wiring layer is formed by a continuous film forming method.

Figure 1F:
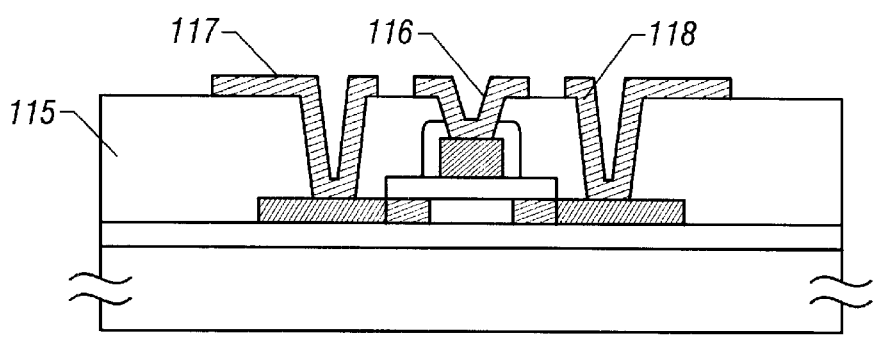

First, a 1,500-Å-thick titanium film is formed by sputtering. Immediately thereafter, a gate electrode/wiring line 116 and source/drain electrodes 117 and 118 are formed by depositing a 5,000-Å-thick aluminum film and then patterning it. Further, hydrogen annealing is performed at 200 to 400° C. Thus, a thin-film transistor shown in FIG. 1F is obtained.

In this embodiment, the interlayer insulating film 115 consisting of multiple layers having different etching rates is formed such that the films having different compositions, that is, the silicon nitride film 115a and the silicon oxide films 115b and 115c are deposited among which the silicon oxide films 115b and 115c are formed with varying rf output values. As a result, tapered contact holes can be formed by an etching method that is commonly employed. Therefore, wiring line disconnection can be prevented which might otherwise occur due to the phenomenon that the gate electrode/wiring line 116 and the source/drain electrodes 117 and 118 are made thinner only at step portions of contact holes.

In this embodiment, since the dense anodic oxide layer 108 is formed around the gate electrode 106, two etching steps are needed to form a contact hole for the gate electrode 106. However, on the other hand, in a process of forming a thin-film transistor on an insulative substrate, the formation of the dense anodic oxide layer 108 provides advantages that the low-concentration impurity regions 112 and 113 can be formed in a self-aligned manner and that the gate electrode 106 can be protected during a heating step.

In the case of a semiconductor integrated circuit formed on a silicon substrate, contact holes can be formed with a single etching step if insulating films (what is called side walls) are formed on the side faces of the gate electrode 106 and the gate electrode 106 is directly covered with the interlayer insulating film 115.

Figure 6:
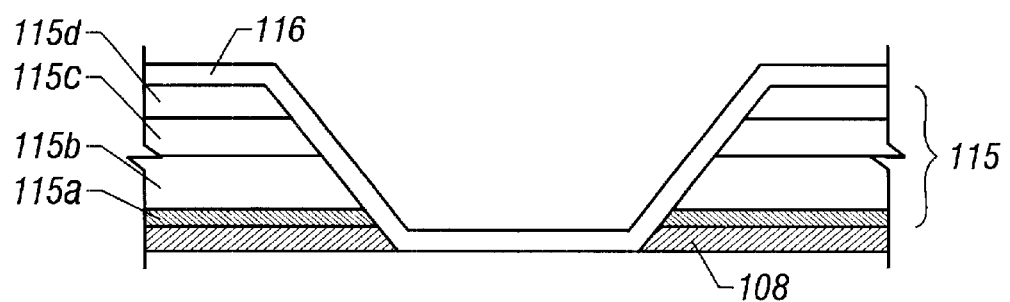
FIG. 6 is a sectional view of a contact hole in accordance with the present invention.

Although in the above embodiment the interlayer insulating film 115 assumes a three-layer structure, the number of layers is not limited to three, but may be any number. For example, to form a four-layer interlayer insulating film 115 as shown in FIG. 6, a first-layer silicon nitride film 115a is formed by plasma CVD at a thickness of 500 Å, and second to fourth-layer silicon oxide films 115b to 115d are formed by using a TEOS material gas with the rf output value varied for the respective films. In this case, the rf output value may be set at 300 W, 150 W, and 50 W for the second to fourth layers, respectively.

Although in the above embodiment the interlayer insulating film 115 is formed such that the rf output value is decreased in a step-like manner in forming the silicon oxide films 115b and 115c to thereby provide different etching rates for the respective films, the rf output value may be decreased continuously in forming the second-layer silicon oxide film onward so that the etching rate of a silicon oxide film increases continuously as the position goes up.

Although in the above embodiment the rf output value is varied to cause the interlayer insulating film 115 to have an etching rate gradient, the kind of material gas, the flow rate of a material gas, the gas ratio, or some other factor may be varied during the film formation instead of the rf output value.

Although in the above embodiment the thickness of the interlayer insulating film 115 is set at 6,500 Å, it is not limited to this value, but may be determined properly in accordance with the etching rates of the interlayer insulating film 115 with respect to an etching method employed.

It is conventionally required to improve the step coverage of wiring lines in contact holes as well as to improve the step coverage of wiring lines formed on the interlayer insulating film 115 by flattening the surface of the interlayer insulating film 115. The surface of the interlayer insulating film 115 may be flatted, for instance, by making the interlayer insulating film 115 thick enough to cancel out protrusions as caused by the gate insulating film 109 etc. formed under the interlayer insulating film 115.

The thickening of the interlayer insulating film 115 necessarily increases the etching time. Therefore, if a single-layer interlayer insulating film is made thicker as in the conventional example, there may occur undesired events that a side face of a contact hole is formed with a large recess, and that a contact hole is reversely tapered, that is, the diameter increases toward the bottom. To solve these problems, an interlayer insulating film is so thick as to allow flattening of its surface, etching back is performed to a thickness of about 5,000 Å, and contact holes are then formed.

In contrast, in the above embodiment, by virtue of the formation of a multi-layer interlayer insulating film whose etching rate increases as the position goes up, tapered contact holes can be formed irrespective of the thickness of the interlayer insulating film. Therefore, contact holes can be formed without etching back even if the interlayer insulating film 115 is made as thick as about 1 μm and its surface is flattened. For example, with the same film forming conditions and etching conditions as in the above embodiment, the interlayer insulating film 115 may be made as thick as about 1 μm by forming the first-layer silicon nitride film 115a and the second and third-layer silicon oxide films 115b and 115c at thicknesses of 500 Å, 9,000 Å and 1,000 Å, respectively.

Further, although in the above embodiment the lowermost layer of the interlayer insulating film 115 is the silicon nitride film 115a, the silicon nitride film 115a may be replaced by a silicon oxynitride film, which is lower in etching rate than a silicon nitride film. A silicon oxynitride film may be formed through plasma CVD by using material gases of silane, a $N_2O$ gas, and an $O_2$ gas. The material gases may be a TEOS gas and a $N_2O$ gas. The thickness of the silicon oxynitride film may be determined properly in accordance with its film quality, thicknesses of silicon oxide films formed thereon, and other factors.

Embodiment 2

Figure 3:
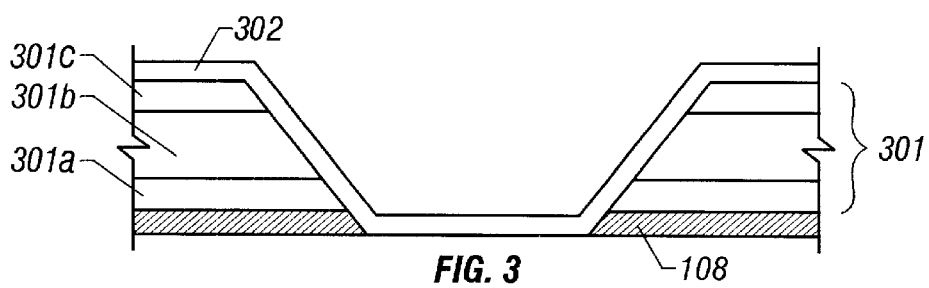
FIG. 3 is a sectional view of a contact hole for a gate electrode according to a second embodiment of the invention.

FIG. 3 is a sectional view showing a contact hole for a gate electrode according to a second embodiment of the invention. In this embodiment, a multi-layer interlayer insulating film is formed only by silicon oxide films.

A state corresponding to the state of FIG. 1E is obtained with the same manufacturing conditions as in the first embodiment (FIGS. 1A to 1E). That is, formed on a glass substrate 101 that is coated with an undercoat film 102 are an active layer including source/drain regions 110 and 111, low-concentration impurity regions 112 and 113, and a channel region 114, a gate insulating film 109, and a gate electrode 106 around which an anodic oxide layer 108 is formed.

In this state, as shown in FIG. 3, an interlayer insulating film 301 of only silicon oxide films are formed through plasma CVD by using a TEOS material gas. The first to third-layer films are given different etching rates by utilizing the fact that the etching rate of a silicon oxide film is higher when the rf output value during film formation is smaller. The first-layer silicon oxide film 301a is formed at a thickness of 4,000 Å with an rf output value of 300 W, the second layer silicon oxide film 301b is formed at 1,000 Å with 150 W, and the third-layer silicon oxide film 301c is formed at 1,000 Å with 50 W. Thus, an interlayer insulating film 301 with a thickness of 6,000 Å is the three layer structure of which etching rate varies in a stepwise manner. Alternatively, a silicon oxide film may be formed with the rf output value decreased continuously during the film formation, in which case the etching rate of a resulting interlayer insulating film 301 continuously increases as the position goes up.

Contact holes are formed by etching the multi-layer interlayer insulating film 301 and the dense anodic oxide layer 108, and then electrodes/wiring lines are formed. Contact holes for the source/drain regions 110 and 111 have a same configuration as that of FIG. 3 except for non-use of the dense anodic oxide layer 108.

To form contact holes, first the interlayer insulating film 301 is etched. Any etching liquid can be used as long as it can etch a silicon oxide film. Buffered hydrofluoric acid (BHF; $NH_3F$:HF=10:1), which is commonly used in the art, is used in this embodiment. In this case, at 20° C., the first to third-layer silicon oxide films 301a to 301c exhibit etching rates of about 2,700 Å/min, about 4,220 Å/min, and about 4,270 Å/min, respectively. Due to these differences in etching rate, contact holes are formed such that the opening is gradually narrowed as the position goes down, that is, tapered contact holes are formed through etching of the interlayer insulating film 301 as shown in FIG. 3. Contact holes for the source/drain regions 110 and 111 are formed in this manner. The dense anodic oxide layer 108 is etched after completion of the etching of the interlayer insulating film 301.

To etch the dense anodic oxide layer 108, an etching liquid that is commonly used for etching of aluminum oxide is used. In this embodiment, etching is performed for 4 minutes by using a mixed acid of 3%-phosphoric acid and 3%-chromic anhydride which is heated to 70° C. Since the interlayer insulating film 301 over the dense anodic oxide layer 108 is etched to assume a tapered profile, the dense anodic oxide layer 108 is also tapered through etching without forming a recess. Thus, a tapered contact hole for the gate electrode 106 is formed as shown in FIG. 3. The etching rate of the dense anodic oxide layer 108 is about 400 Å/min.

After the contact holes are formed, a 1,500-Å-thick titanium film is formed by sputtering. Immediately thereafter, a gate electrode/wiring line 302 and source/drain electrodes are formed by forming a 5,000-Å-thick aluminum film and then patterning it.

According to this embodiment, the interlayer insulating film 301 consisting of three layers having different etching rates can be formed by depositing the silicon oxide films 301a to 301c while varying the rf output value for the respective layer. As a result, as shown in FIG. 3, tapered contact holes can be formed by an etching method that is commonly employed. Therefore, wiring line disconnection can be prevented which might otherwise occur due to the phenomenon that the gate electrode/wiring line 302 and the source/drain electrodes are made thinner only at step portions of contact holes.

Although in the above embodiment the rf output value is varied to cause the interlayer insulating film 301 to have an etching rate gradient, the kind of material gas, the flow rate of a material gas, the gas ratio, or some other factor may be varied during the film formation instead of the rf output value.

The number of layers and the thickness of the interlayer insulating film 301 is not limited to those of the above embodiment, but may be determined properly in consideration of etching rates with respect to an etching method employed.

Figure 8A:
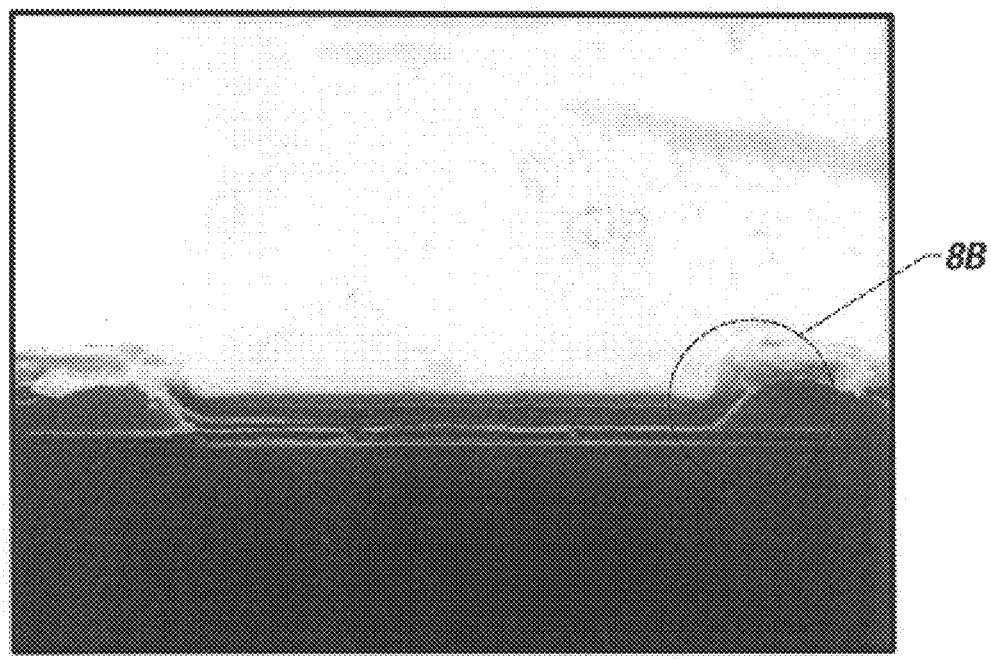
FIGS. 8A and 8B are SEM photographs corresponding to FIG. 3.
Figure 8B:
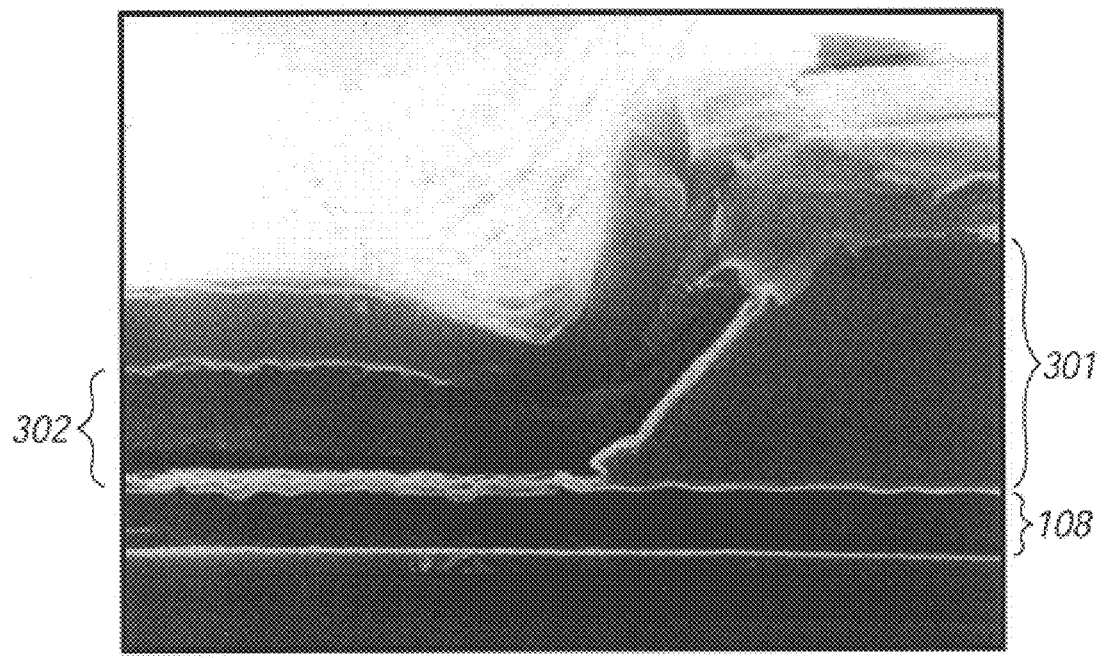
Figure 9A:
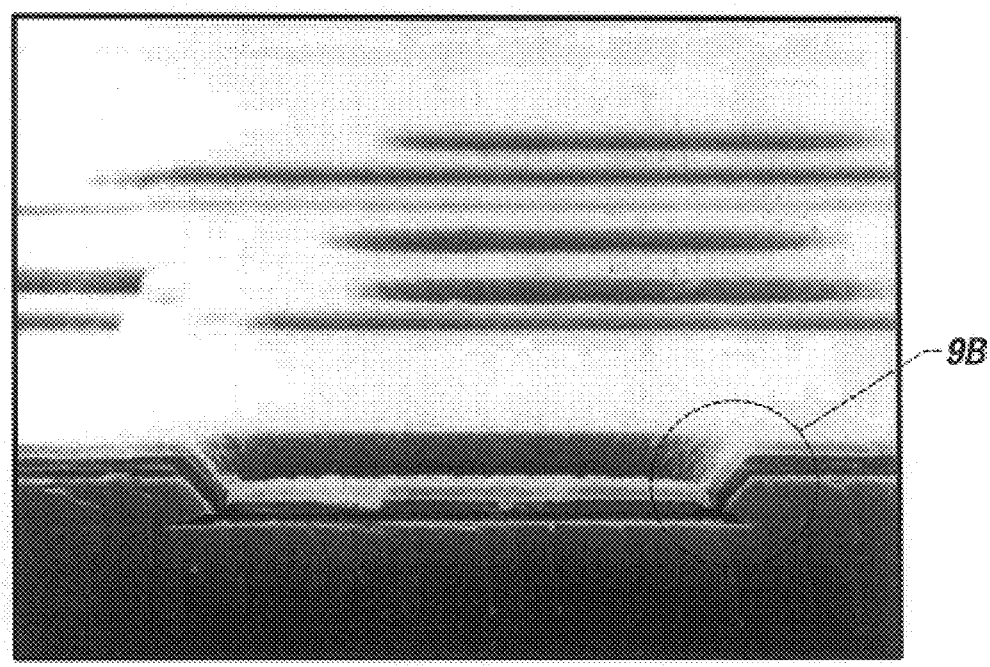
FIGS. 9A and 9B are SEM photographs corresponding to FIG. 4.
Figure 9B:
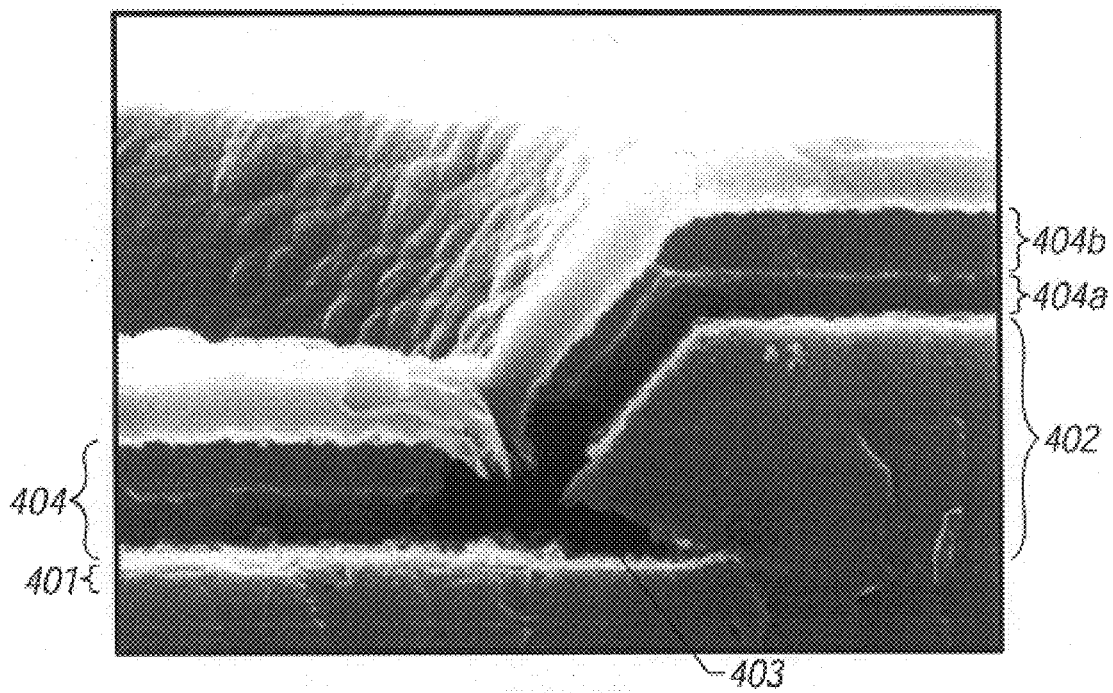

FIGS. 8A and 8B are SEM photographs showing the contact hole of FIG. 3.

Embodiment 3

Figure 5:
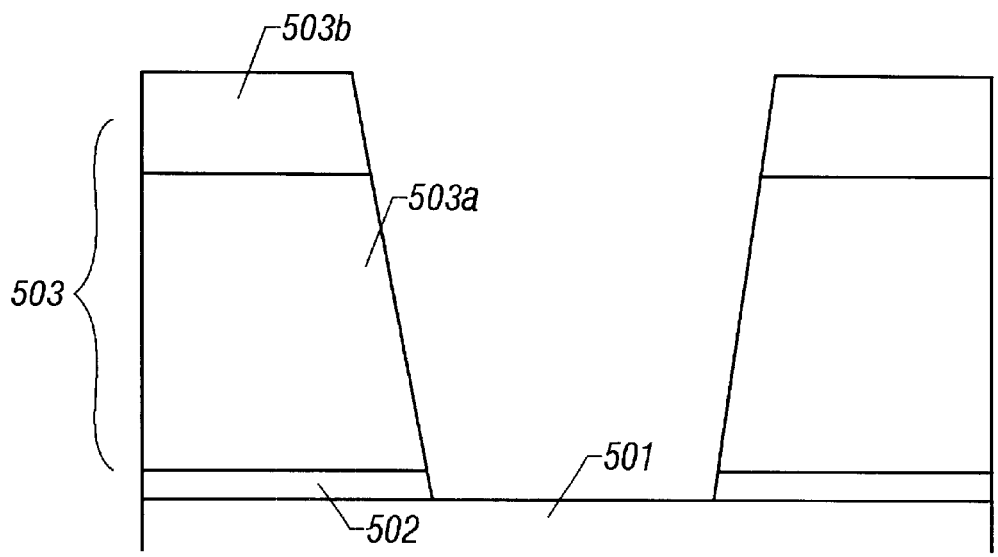
FIG. 5 is a sectional view of a contact hole for a source/drain region according to a third embodiment of the invention.

FIG. 5 is a sectional view of a contact hole for a source/drain region according to a third embodiment of the invention. In this embodiment, a silicon nitride film of 200 to 500 Å in thickness is formed as the lowermost layer of an interlayer insulating film. Although this embodiment has the same structure as the first embodiment, the former has a different effect than the latter, which effect will be described below.

Referring to FIG. 5, reference numeral 501 denotes a crystalline silicon island-like film and numeral 502 denotes a 250-Å-thick silicon nitride film. The silicon nitride film 502 is formed by plasma CVD under the following film forming conditions:

Material gases: $SiH_4$ (10 sccm); $NH_3$ (75 sccm); $N_2$ (500 sccm)

Film forming pressure: 0.7 torr

Application power: 300 W

Film forming temperature: 350° C.

An interlayer insulating film 503, that is, silicon oxide films 503a and 503b having different etching rates are deposited thereon. The film forming conditions etc. of the interlayer insulating film 503 are the same as those of the first and second embodiments, and are therefore not described here.

Thereafter, a contact hole is formed by etching the interlayer insulating films 502 and 503 with a buffered hydrofluoric acid solution. Because the silicon nitride film 502 and the silicon oxide films 503a and 503b have different etching rates, a resulting contact hole assumes a tapered profile (see FIG. 5).

Figure 4A:
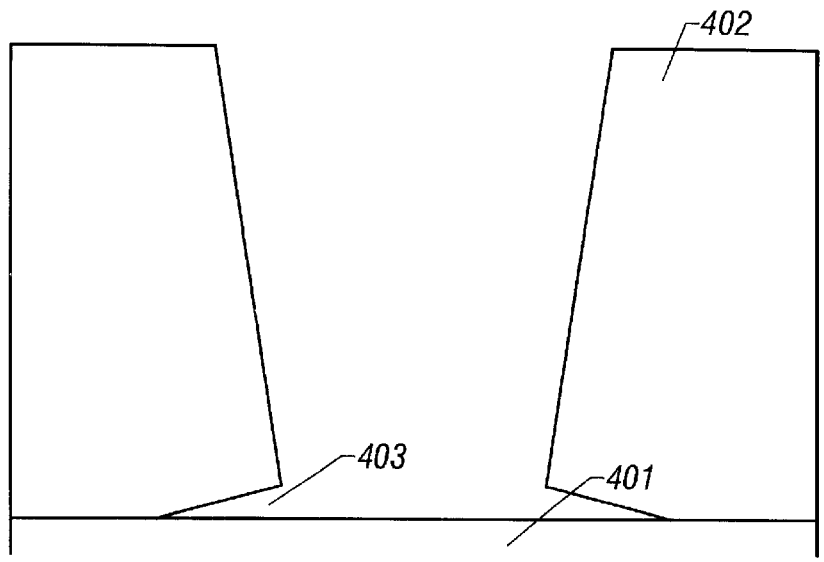
FIGS. 4A and 4B are sectional views of a contact hole for a source/drain region in a conventional semiconductor device.
Figure 4B:
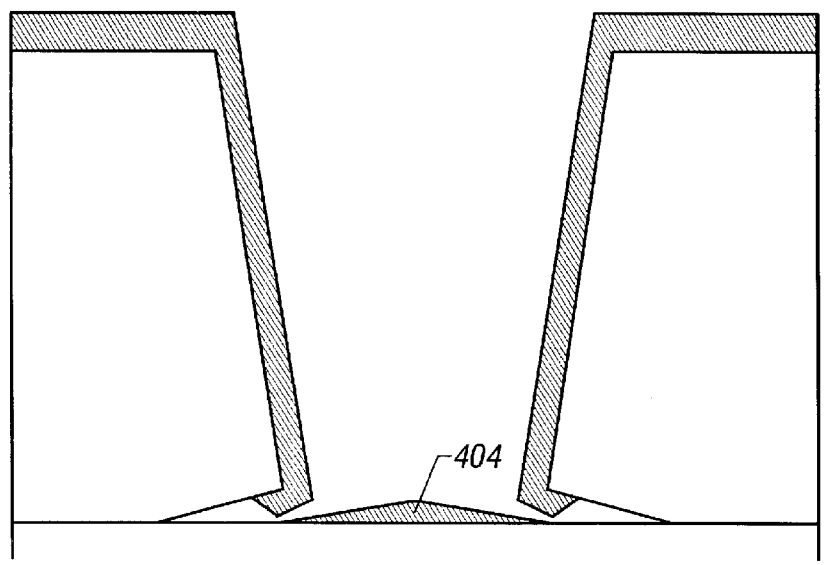

No wedge-shaped recess is formed in the structure of this embodiment in which the silicon nitride film 502 is interposed between the island-like silicon film 501 and the interlayer insulating film 503, which structure is different from the structure of FIG. 4 (the island-like silicon film and the interlayer insulating film composed of silicon oxide films are in direct contact).

Figure 10A:
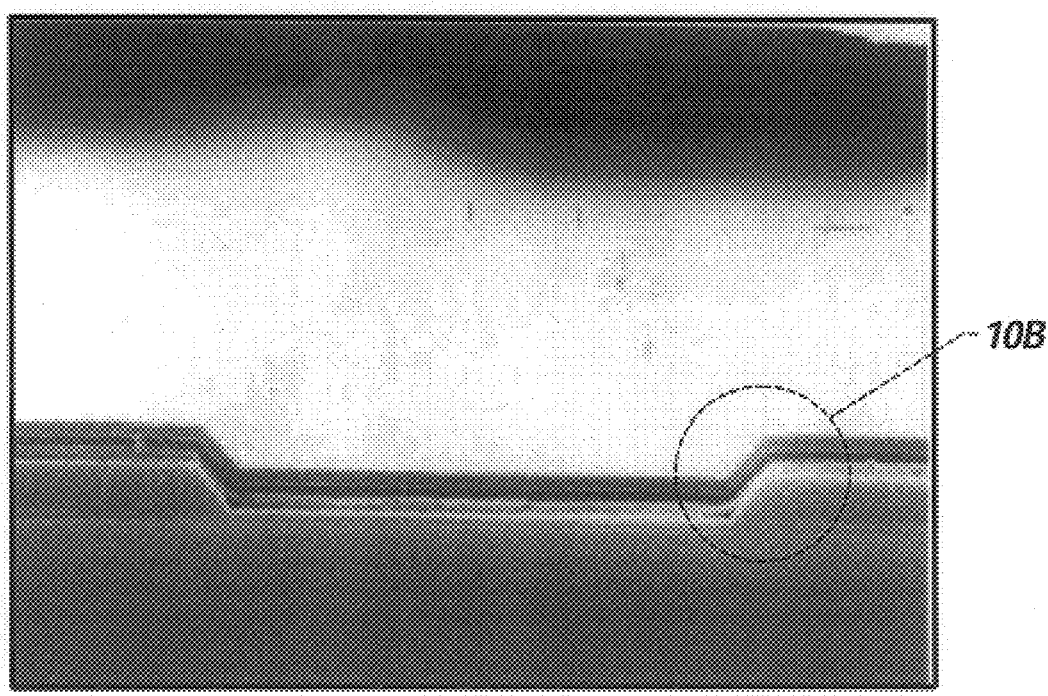
FIGS. 10A and 10B are SEM photographs corresponding to FIG. 5.
Figure 10B:
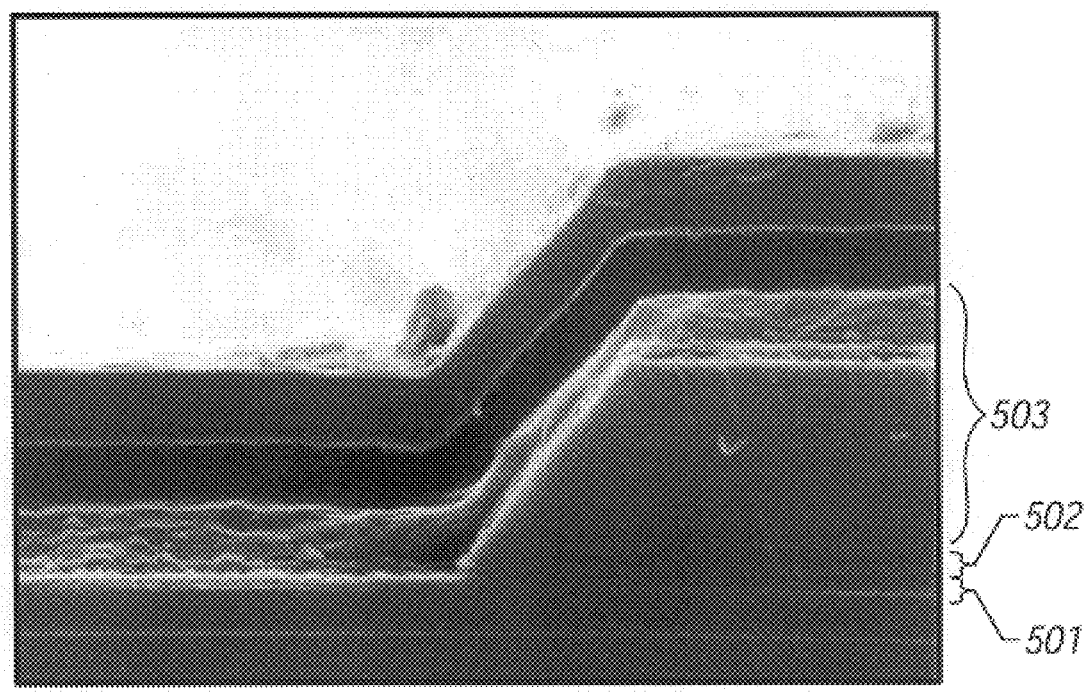

Although the reason of the above phenomenon is unknown at present, the structure of this embodiment provides contact holes that are so shaped as to be easily covered with wiring lines. This is very advantageous in forming wiring lines that are free of disconnection. FIGS. 10A and 10B are SEM photographs corresponding to FIG. 5.

In the invention, since an insulating film is formed such that its etching rate increases continuously or in a step-like manner as the position goes up by varying the film forming conditions, tapered contact holes can be formed through the insulating film without the need of special control of the etching conditions. As a result, a wiring line formed in a contact hole is given good step coverage.

Specifically, an insulating film having multiple layers of different etching rates can be formed by utilizing the facts that films having different compositions such as a silicon nitride film and a silicon oxide film exhibit different etching rates, and that the etching rate of a silicon oxide film is higher when the rf output value is smaller.

A contact hole that is free of a wedge-shaped recess can be formed by employing a silicon nitride film as the lowermost layer of an interlayer insulating film. This enables a wiring line formed in a contact hole to have good step coverage.

Further, since tapered contact holes can be formed irrespective of the thickness of an insulating film, tapered contact holes can be formed without etching back even if a deposited insulating film is so thick as to allow flattening of its surface. Therefore, a wiring line formed in a contact hole as well as a wiring line formed on the surface of an insulating film is given good step coverage.

In addition, since an insulating film is formed only by CVD, it can be formed at such a temperature that there occurs neither aluminum diffusion nor abnormal crystal growth of aluminum. Therefore, an interlayer insulating film having multiple layers of different etching rates as described above can be formed in manufacturing thin-film transistors having aluminum electrodes.

The present invention described in the present specification can be used for an active matrix liquid crystal display device and an active matrix electro luminescence display device which are integrated with a peripheral driving circuit. These display devices are called as a flat panel display device. The followings are examples of the applications to which the display panel using the present invention is mounted.

Figure 12A:
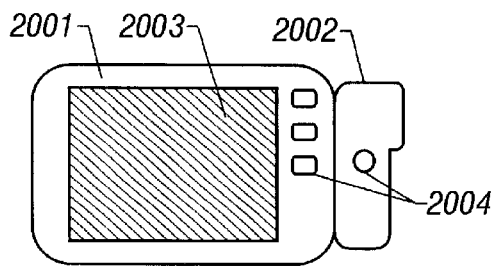
FIGS. 12A–12D show examples of electronic devices utilizing a flat panel display device in accordance with the present invention.

FIG. 12A shows a device called as a digital steel camera or an electron camera.

The device has a function of saving an image photographed with CCD camera electronically. The CCD camera is arranged at a camera part 2002. Also, the device has a function of displaying the image in the display panel 2003 arranged in the body 2001. Moreover, it is well known the device having all kinds of communication facility and information memory means to be utilized as an information terminal. The operation of the device is conducted by the operation button 2004.

Figure 12B:
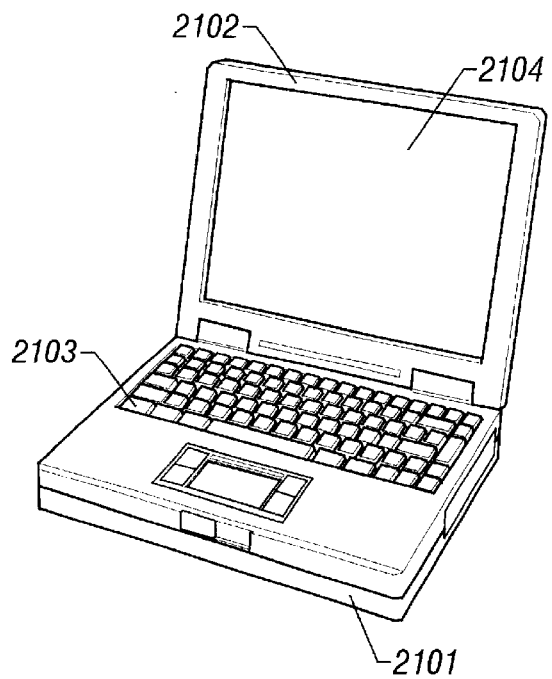

FIG. 12B shows a portable personal computer. The device has a display device 2104 in accordance with the present invention on the cover 2102, which can open and close, and it can input information of all kinds from a keyboard 2103 and conduct various operation.

Figure 12C:
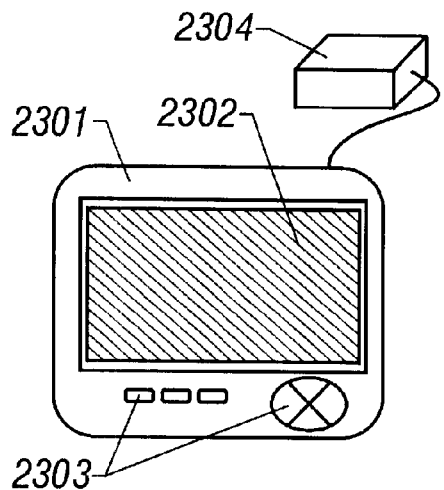

FIG. 12C shows an example of a car navigation system utilizing a flat panel display in accordance the present invention. The car navigation system has a body composed of an antenna part 2304 and a display device 2302.

Changing over information of all kinds being necessary for navigation is conducted by an operation button 2303. Also, various kinds of operations are conducted by remote control device which is generally not shown.

Figure 12D:
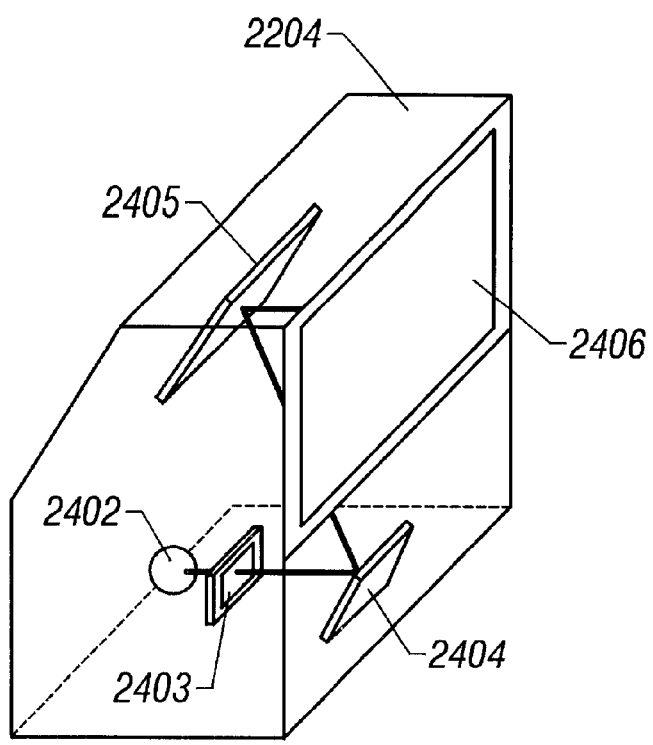

FIG. 12D shows an example of a projection type liquid crystal display device. In the figure, light radiated from a light source 2402 is modulated optically to be image by the liquid crystal display device 2403 in accordance with the present invention. The image is reflected by mirrors 2404 and 2405 to be projected on a screen 2406.

While the invention has been described with reference to the preferred embodiments, it is to be understood that many modifications may be made without departing the scope of the appended claims.

Figure 11:
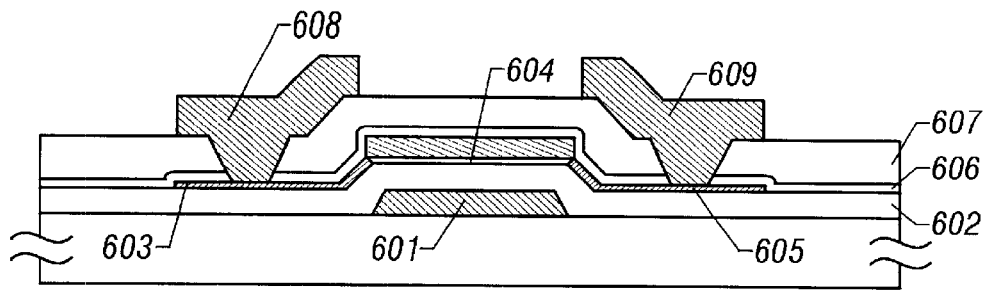
FIG. 11 is a sectional view of a thin film transistor in accordance with the present invention.

For example, a top-gate type thin film transistor has been discussed in the preferred embodiment. However, a bottom-gate type transistor may be used in place of the top-gate transistor as shown in FIG. 11. In FIG. 11, reference numeral 601 denotes a gate electrode; 602 denotes a gate insulating film; 603–605 denote source, channel and drain comprising crystalline silicon, respectively; 606 denotes a silicon nitride layer; 607 denotes a silicon oxide layer; and 608–609 denote source and drain electrodes.

Also, in place of using an anodic oxidation method for forming an oxide around a gate electrode, it is possible to use a plasma oxidation, in which the gate electrode is exposed to an oxygen plasma.

Further, it is possible to use titanium, tantalum, doped silicon, or metal silicide in place of aluminum as a material of wirings.

Moreover, the formation method of the interlayer insulating film in accordance with the present invention should not be limited to a plasma CVD. Other methods such as thermal CVD and sputtering may be employed.

What is claimed is:

1. A semiconductor device comprising:
a substrate having an insulating surface;
a gate electrode formed on the insulating surface;
a gate insulating film formed on the gate electrode;
a semiconductor island formed on the gate insulating film, said semiconductor island comprising a source region, a drain region and a channel region;
a first interlayer insulating film comprising silicon nitride and formed on and in direct contact with the semiconductor island;
a second interlayer insulating film comprising silicon oxide and formed on the first interlayer insulating film, said second interlayer insulating film including:
 a first dielectric layer formed on the first interlayer insulating film, and
 a second dielectric layer formed on the first dielectric layer,
wherein the second dielectric layer has a higher etching rate than the first dielectric layer;
a contact hole in the first and second interlayer insulating films on one of the source and drain regions; and
a lead formed through the first and second interlayer insulating films and connected to the one of the source and drain regions,
wherein the contact hole has a tapered configuration,
wherein a diameter of the contact hole increases from a lower portion thereof to an upper portion thereof,
wherein each of the first and second dielectric layers is formed through plasma CVD,
wherein the second dielectric layer is formed with a smaller radio frequency power than the first dielectric layer.

2. A device according to claim 1,
wherein the semiconductor device is one selected from the group consisting of a digital still camera, an electron camera, a portable personal computer, a car navigation system, and a projection type liquid crystal display device.

3. A device according to claim 1,
wherein the semiconductor island comprises crystalline silicon.

4. A device according to claim 1,
wherein the semiconductor device is an active matrix type electro luminescence display device.

5. A semiconductor device comprising:
a substrate having an insulating surface;
a semiconductor island including a source region, a drain region and a channel region,
said semiconductor island formed over the substrate; a gate insulating film formed on the channel region;
a gate electrode formed on the gate insulating film;
a gate wiring including the gate electrode formed over the channel region;
a first insulating film comprising silicon nitride and covering the gate wiring,
wherein the first insulating film is formed on and in direct contact with the semiconductor island;
a second insulating film comprising silicon oxide and formed on the first insulating film,
said second insulating film including:
 a first dielectric layer formed on the first insulating film, and
 a second dielectric layer formed on the first dielectric layer,
wherein the second dielectric layer has a higher etching rate than the first dielectric layer,
a contact hole opened through the first insulating film and the second insulating film to reach one of the source and drain regions,
wherein the contact hole has a tapered configuration,
wherein a diameter of the contact hole increases from a lower portion thereof to an upper portion thereof,
wherein each of the first and second dielectric layers is formed through plasma CVD,
wherein the second dielectric layer is formed with a smaller radio frequency power than the first dielectric layer.

6. A device according to claim 5,
wherein the semiconductor device is one selected from the group consisting of a digital still camera, an electron camera, a portable personal computer, a car navigation system, and a projection type liquid crystal display device.

7. A device according to claim 5,
wherein the semiconductor island comprises crystalline silicon.

8. A device according to claim 5,
wherein the semiconductor device is an active matrix type electro luminescence display device.

9. A semiconductor device comprising:
a substrate having an insulating surface;
a thin film transistor comprising:
 a source region, a drain region and a channel region, a gate electrode adjacent to the channel region with a gate insulating film interposed therebetween,
wherein the source, drain and channel regions are formed in a semiconductor island;
an interlayer insulator covering the thin film transistor; and
a lead connected to one of the source and drain regions through a contact hole being provided in the interlayer insulator,
wherein the interlayer insulator comprises,
 a first insulating film comprising silicon nitride,
 a second insulating film comprising silicon oxide and formed on the first insulating film,
wherein the second insulating film has a larger etching rate than the first insulating film,
wherein the second insulating film has a lower layer and an upper layer,
wherein an etching rate increases from the lower layer to the upper layer,
wherein the contact hole has a tapered configuration,
wherein a diameter of the contact hole is larger at the upper layer than at the lower layer,
wherein the first insulating film is formed on and in direct contact with the semiconductor island,
wherein the second insulating film is formed through plasma CVD,
wherein the second insulating film is formed with radio frequency power decreasing from the lower layer to the upper layer.

10. A device according to claim 9,
wherein the semiconductor device is one selected from the group consisting of a digital still camera, an electron camera, a portable personal computer, a car navigation system, and a projection type liquid crystal display device.

11. A device according to claim 9,
wherein the semiconductor island comprises crystalline silicon.

12. A device according to claim 9,
wherein the semiconductor device is an active matrix type electro luminescence display device.

13. A projection device having a light source for producing light, a liquid crystal device for modulating the light and a screen for projecting thereon the light passing through the liquid crystal device, said liquid crystal device comprising:
a substrate having an insulating surface;
a thin film transistor comprising:
a source region, a drain region and a channel region, a gate electrode adjacent to the channel region with a gate insulating film interposed therebetween,
wherein the source, drain and channel regions are formed in a semiconductor island;
an interlayer insulator covering the thin film transistor; and
a lead connected to one of the source and drain regions through a contact hole provided in the interlayer insulator,
wherein the interlayer insulator comprises,
a first insulating film comprising silicon nitride, and
a second insulating film comprising silicon oxide and formed on the first insulating film,
wherein the second insulating film has a larger etching rate than the first insulating film,
wherein the second insulating film has a lower layer and an upper layer,
wherein an etching rate increases from the lower layer to the upper layer,
wherein the contact hole has a tapered configuration,
wherein a diameter of the contact hole is larger at the upper layer than at the lower layer,
wherein the first insulating film is formed on and in direct contact with the semiconductor island,
wherein the second insulating film is formed through plasma CVD,
wherein the second insulating film is formed with radio frequency power decreasing from the lower layer to the upper layer.

14. A device according to claim 13,
wherein the semiconductor island comprises crystalline silicon.

* * * * *